US006957608B1

(12) United States Patent
Hubert et al.

(10) Patent No.: US 6,957,608 B1
(45) Date of Patent: Oct. 25, 2005

(54) CONTACT PRINT METHODS

(75) Inventors: Brian Hubert, Menlo Park, CA (US); Colin Bulthaup, San Mateo, CA (US); Chris Gudeman, Los Gatos, CA (US); Chris Spindt, Menlo Park, CA (US); Scott Haubrich, Castro Valley, CA (US); Mao Takashima, Mountain View, CA (US); Joerg Rockenberger, Redwood City, CA (US); Klaus Kunze, Half Moon Bay, CA (US); Fabio Zurcher, Brisbane, CA (US)

(73) Assignee: Kovio, Inc., Redwood City, CA (US)

( * ) Notice: Subject to any disclaimer, the term of this patent is extended or adjusted under 35 U.S.C. 154(b) by 52 days.

(21) Appl. No.: 10/288,357

(22) Filed: Nov. 4, 2002

Related U.S. Application Data

(60) Provisional application No. 60/400,795, filed on Aug. 2, 2002.

(51) Int. Cl.[7] .................................................. B41C 1/00

(52) U.S. Cl. .......................... 101/483; 430/320; 101/28

(58) Field of Search .............................. 101/483, 415.1, 101/28, 128.2, 128.21, 128.16, 115; 438/754, 780; 216/41, 44, 83, 100, 54; 264/1.1, 1.24; 436/320, 322, 330, 312; 428/201, 262

(56) References Cited

U.S. PATENT DOCUMENTS

| | | | |
|---|---|---|---|
| 3,626,844 A | 12/1971 | Priesmeyer | 101/3 SP |
| 3,883,383 A | 5/1975 | Leitz, Jr. | 156/242 |
| 3,934,503 A | 1/1976 | Kinney et al. | 101/128.2 |
| 4,242,401 A | 12/1980 | Mitani et al. | 428/201 |
| 4,374,077 A | 2/1983 | Kerfeld | 264/22 |
| 4,444,808 A | 4/1984 | Kikuchi et al. | 427/143 |
| 4,487,811 A | 12/1984 | Eichelberger et al. | 428/546 |
| 4,526,098 A | 7/1985 | Bachman | 101/115 |

(Continued)

FOREIGN PATENT DOCUMENTS

| | | | |
|---|---|---|---|
| DE | 198 58 759 C1 | 3/2000 | H01L/25/065 |
| WO | WO 97/06468 | 2/1997 | |
| WO | WO 97/38810 | 10/1997 | B22F/3/105 |
| WO | WO 98/03896 | 1/1998 | G02F/1/133 |
| WO | WO 98/41898 | 9/1998 | G02F/1/16 |
| WO | WO 00/20916 | 4/2000 | G02F/1/01 |
| WO | WO 00/30869 | 6/2000 | B44F/1/14 |
| WO | WO 01/20402 A1 | 3/2001 | G03F/7/00 |
| WO | WO 01/73150 A1 | 10/2001 | C23C/8/00 |
| WO | WO 01/88540 A1 | 11/2001 | G01N/33/543 |

OTHER PUBLICATIONS

Younan Xia et al., “Unconventional Methods for Fabricating and Patterning Nanostructures”, 1999 American Chemical Society. pp. 1823–1848.

Younan Xia et al., “Soft Lithography”, Chem. Int. Ed, 1998, pp. 551–564.

Olivier J.A. Schueller et al., “Fabrication of glassy carbon microstructures by soft lithography”, Sensors and Actuators A72. 1999, pp. 125–139.

H. Schift et al., “Nanostructuring of Polymers and Fabrication of Interdigitated Electrodes by Hot Embossing Lithography”, Microelectronic Engineering 46, 1999, pp. 121–124.

M. Colburn et al., “Step and Flash Imprint Lithography: A New Approach to High–Resolution Patterning”, XP–002126733. Mar. 1999. SPIE vol. 3676, pp. 379–389.

*Primary Examiner*—Eugene H. Eickholt
(74) *Attorney, Agent, or Firm*—Haverstock & Owens LLP

(57) ABSTRACT

A method of and device for controlled printing using liquid embossing techniques is disclosed. In accordance with the embodiments of the invention a stamp comprises a differentiated embossing surface with protruding and recessed surfaces to enhance the ability of the stamp to selectively displace liquid ink from a print surface and/or remove solvent from the liquid in a soft curing process. A stamp with differentiated surfaces is fabricated by selectively coating, or otherwise treating the protruding features, the recessed features, or a combination thereof, such that the surface energies and/or wettability of the protruding surfaces and the recessed surfaces are differentiated.

43 Claims, 12 Drawing Sheets

U.S. PATENT DOCUMENTS

| | | | | | |
|---|---|---|---|---|---|
| 4,775,439 | A | | 10/1988 | Seeger, Jr. et al. | 156/231 |
| 4,808,274 | A | | 2/1989 | Nguyen | 204/15 |
| 4,862,799 | A | | 9/1989 | Hycner et al. | 101/348 |
| 4,957,808 | A | | 9/1990 | Arai et al. | 428/262 |
| 5,009,708 | A | | 4/1991 | Grunwald et al. | 106/105 |
| 5,245,932 | A | | 9/1993 | Ujiie | 101/128.11 |
| 5,259,926 | A | | 11/1993 | Kuwabara et al. | 156/659.1 |
| 5,262,357 | A | | 11/1993 | Alivisatos et al. | 437/233 |
| 5,279,689 | A | | 1/1994 | Shvartsman | 156/220 |
| 5,368,789 | A | | 11/1994 | Kamitakahara et al. | 264/1.33 |
| 5,466,319 | A | | 11/1995 | Zager et al. | 156/220 |
| 5,491,114 | A | | 2/1996 | Goldstein | 437/233 |
| 5,512,131 | A | | 4/1996 | Kumar et al. | 156/655.1 |
| 5,531,944 | A | | 7/1996 | Frisch | 264/52 |
| 5,559,057 | A | | 9/1996 | Goldstein | 437/228 |
| 5,575,878 | A | | 11/1996 | Cox et al. | 156/247 |
| 5,576,248 | A | | 11/1996 | Goldstein | 437/225 |
| 5,662,040 | A | | 9/1997 | Mori et al. | 101/128.21 |
| 5,670,279 | A | | 9/1997 | Goldstein | 430/5 |
| 5,712,018 | A | | 1/1998 | Frisch | 428/158 |
| 5,746,868 | A | | 5/1998 | Abe | 156/247 |
| 5,772,905 | A | | 6/1998 | Chou | 216/44 |
| 5,804,017 | A | | 9/1998 | Hector | 156/242 |
| 5,892,230 | A | | 4/1999 | Goodberlet et al. | 250/361 R |
| 5,900,160 | A | | 5/1999 | Whitesides et al. | 216/41 |
| 5,937,758 | A | | 8/1999 | Maracas et al. | 101/327 |
| 5,966,580 | A | | 10/1999 | Watanabe et al. | 419/9 |
| 6,027,595 | A | | 2/2000 | Suleski | 156/230 |
| 6,039,897 | A | * | 3/2000 | Lochhead et al. | 264/1.24 |
| 6,072,716 | A | | 6/2000 | Jacobson et al. | 365/163 |
| 6,089,853 | A | | 7/2000 | Biebuyck et al. | 425/447 |
| 6,096,247 | A | | 8/2000 | Ulsh et al. | 264/2.7 |
| 6,139,626 | A | | 10/2000 | Norris et al. | 117/68 |
| 6,180,239 | B1 | * | 1/2001 | Whitesides et al. | 101/378 |
| 6,274,412 | B1 | | 8/2001 | Kydd et al. | 438/149 |
| 6,277,448 | B2 | | 8/2001 | Strutt et al. | 427/452 |
| 6,277,740 | B1 | | 8/2001 | Goldstein | 438/660 |
| 6,294,401 | B1 | | 9/2001 | Jacobson et al. | 438/99 |
| 6,303,499 | B1 | | 10/2001 | Sato | 438/676 |
| 6,306,594 | B1 | | 10/2001 | Cozzette et al. | 435/6 |
| 6,309,798 | B1 | | 10/2001 | Reetz et al. | 430/296 |
| 6,322,736 | B1 | * | 11/2001 | Bao et al. | 264/105 |
| 6,375,870 | B1 | * | 4/2002 | Visovsky et al. | 264/1.31 |
| 6,380,101 | B1 | * | 4/2002 | Breen et al. | 438/765 |
| 6,403,397 | B1 | * | 6/2002 | Katz | 338/99 |
| 6,504,226 | B1 | | 1/2003 | Bryant | 257/510 |
| 6,517,995 | B1 | * | 2/2003 | Jacobson et al. | 430/320 |
| 6,518,168 | B1 | * | 2/2003 | Clem et al. | 438/623 |
| 6,627,571 | B1 | | 9/2003 | Lugmair et al. | 502/2 |
| 2002/0050220 | A1 | * | 5/2002 | Schueller et al. | |
| 2003/0010241 | A1 | * | 1/2003 | Fujihara et al. | 101/483 |
| 2003/0016196 | A1 | | 1/2003 | Lueder et al. | 345/82 |
| 2003/0047535 | A1 | * | 3/2003 | Schueller et al. | 216/41 |
| 2003/0082485 | A1 | | 5/2003 | Bulthaup et al. | 430/312 |
| 2003/0168639 | A1 | | 9/2003 | Cheon et al. | 252/500 |
| 2003/0175427 | A1 | | 9/2003 | Loo et al. | 427/256 |
| 2003/0203649 | A1 | | 10/2003 | Carter | 438/780 |

* cited by examiner

CONTACT PRINT METHODS

RELATED APPLICATION(S)

This Patent Application claims priority under 35 U.S.C. 119(e) of the co-pending U.S. Provisional Patent Application Ser. No. 60/400,795, filed Aug. 2, 2002, and entitled "CONTROLLED PRINT METHODS". The Provisional Patent Application, Ser. No. 60/400,795, filed Aug. 2, 2002, and entitled "CONTROLLED PRINT METHODS" is also hereby incorporated by reference.

FIELD OF THE INVENTION

This invention relates to the field of contact printing for the fabrication of micro-devices. More particularly, this invention relates to systems, devices for and methods of controlling print quality using liquid embossing techniques for the fabrication of micro-devices.

BACKGROUND OF THE INVENTION

Micro-mechanical, micro-electrical, and micro-optical devices are most typically fabricated using mask and etching steps to define each patterned layer within the device. These steps are labor intensive, expensive and typically require specialized processing equipment specifically tailored for a single fabrication process.

One of the goals for nano-technology is the development of techniques and materials that enable the fabrication of micro-electronic devices on a variety of substrates using contact printing methods which allows for the direct replication of patterned device layers. Contact printing methods offer a reduction in the number of steps required to fabricate micro-devices as well as provide for the development of diversified processing methods for printing a wide range of patterned device layers on a wide range of substrate surfaces cheaply and with high throughput.

There are a number of challenges to developing methods of contact printing for the fabrication of micro-devices, including but not limited to developing inks that are suitable for patterning by contact print methods and developing systems suitable for producing multiple prints with high throughput. Accordingly, there is a continued need for new methods of and systems for fabricating patterned device layers using contact print methods.

SUMMARY OF THE INVENTION

The present invention is directed to methods of and systems for controlled printing using liquid embossing techniques. The method and system of the present invention is particularly useful for fabricating patterned device layers for micro-electronic, micro-optical or micro-mechanical devices (viz. micro-devices). For example, liquid embossing is used to fabricate thin film transistors (TFTs), and other electronic devices, alone or in combination with physical deposition processes. Methods and materials for the fabrication of micro-electronic devices using liquid embossing techniques in combination with physical deposition techniques are further described in the U.S. patent application Ser. No. 10/251,077, filed Sep. 20, 2002, and entitled. "FABRICATION OF MICRO-ELECTRONIC DEVICES", the contents of which are hereby incorporated by reference.

Liquid embossing involves depositing or coating a layer of liquid ink onto a suitable substrate or print medium. Suitable substrates and print media include silicon, quartz, glass, metal, sapphire and polymer substrates. Liquid embossing is also used to print device layers over any number of previously formed device layers or partial device structures. The layer of liquid ink is deposited, or coated, onto the substrate or the print medium using any suitable technique including, but not limited to, spin-coating, ink-jet coating, extrusion coating and dip coating. The preferred technique for depositing, or coating, the layer of liquid ink onto the substrate or the print medium depends on the properties of both the substrate or print medium and the liquid ink.

Liquid inks, in accordance with the embodiments of the invention, comprise nanoparticles that are dispersed in a solvent medium. The solvent medium preferably comprises an organic solvent having five or more carbon atoms. Suitable organic solvents include, but are not limited to, tetralin, cyclohexylbenzene, terpineols, 2-ethylhexanol, 3-octanol, indan, dimethylbenzene, gamma-butyrolactone, cyclohexanone, dihydrobenzofuran, decaline, 1-heptanol, 2-methyl-2,4-pentanediol, phenetylalcohol, citronellol, geraniol, diethyleneglycolmonoethylether, diethyleneglycolmonomethylether, phenetole, ethyllactate, diethylphthalate, glyme, diglyme, triglyme, tetraglyme, pine oil, cineole, octanol, hexanol and pentanol.

Nanoparticles used in liquid ink formulations, in accordance with the embodiments of the invention, are metal nanoparticles, semiconductor nanoparticles, dielectric nanoparticles, magnetic nanoparticles, piezo-electric nanoparticles, pyro-electric nanoparticles, oxide nanoparticles or combinations thereof and, preferably, have sizes in a range of 1.0–100 nanometers. Where the nanoparticles are metal nanoparticles, the nanoparticles preferably comprise a metal selected from Ag, Pd, Rh, Cu, Pt, Ni, Fe, Ru, Os, Mn, Sn, Cr, Mo, W, Co, Ir, Zn, Au, Cd and a combination thereof. Nanoparticle inks and method for making the same are further described in the U.S. patent application Ser. No. 10/215,952, filed Aug. 9, 2002, and entitled "NANOPARTICLE SYNTHESES AND THE FORMATION OF INKS THEREFROM", the contents of which are hereby incorporated by reference. In accordance with further embodiments of the present invention, a liquid ink comprises a polymer, or a polymer precursor, such as a photo-resist polymer and/or a spin-on-glass polymer. Nanoparticles, in accordance with further embodiments of the invention, are dispensed in a solvent and combined with a polymer precursor for depositing metallic-polymer thin films.

Regardless of the materials used to form a liquid ink, in order to emboss a layer of the liquid ink, a stamp with a patterned region comprising protruding features is brought into contact with a layer of the liquid ink, such that the protruding features displace the liquid link from or across the substrate surface to form a patterned layer. After the patterned layer is formed, the patterned layer is then cured to form a solid patterned device layer. In order to facilitate the adhesion of the patterned device layer to the substrate structure or print medium and/or to provide ohmic contact of the patterned device layer with a substrate and/or other device layer(s) therebelow, an adhesion promoter or interface layer can be formed prior to depositing or coating the liquid ink. Adhesion promoters and/or interface layers are further described in U.S. patent application Ser. No. 10/226,903, filed Aug. 22, 2002, entitled "INTERFACE LAYER FOR THE FABRICATION OF ELECTROIC DEVICES", the contents of which are hereby incorporated by reference.

Stamps suitable for liquid embossing can be formed from any number or materials or combinations of materials, but preferably comprise an elastomeric material, such as polydimethylsiloxane (PDMS). Methods for making stamps are described in U.S. patent application Ser. No. 09/525,734, filed Sep. 13, 2000, entitled "Fabrication of Finely Featured Devices by Liquid Embossing", the contents of which are also hereby incorporated by reference.

A number of factors influence the ability to produce patterned device layers with a high degree of feature integrity and definition using a liquid embossing process. For example, it is preferable that the surface energies between the protruding features of the stamp and the liquid ink are sufficiently mismatched, and the surface energies between the substrate surface, or print medium surface, and the liquid ink are sufficiently mismatched, such that the liquid ink is readily displaced from the surface of the substrate by the protruding features of the stamp when the stamp is brought into contact with the layer of liquid ink. The ability of the protruding features to displace liquid ink is also affected by the geometry of the protruding features, as explained in detail below.

Another important factor that influences the ability to produce patterned device layers with a high degree of feature integrity and definition using a liquid embossing process, is the rate with which one or more liquid ink solvents are absorbed by the stamp. Preferably, the stamp, or at least a portion of the stamp, absorbs one or more of the ink solvents in order to "set" or "partially cure" the printed liquid layer during the embossing process before the stamp is removed from contact with the printed liquid layer. Solvent absorption by the stamp to set the printed liquid layer during the embossing process, also referred to herein as "soft curing", is believed to be an important means for preventing the patterned layer from re-flowing into regions of the substrate surface where the liquid ink has been displaced by the protruding features.

The method and the system of the present invention preferably utilize a stamp structure with differentiated protruding surfaces and recessed surfaces to enhance the printing capabilities of the stamp. In accordance with the embodiments of the invention, a stamp is modified to render the protruding surfaces substantially different from the recessed surfaces. The stamp, in accordance with the present invention, is modified by treating the protruding features, the recessed features or a combination thereof, with a surface modifier (such as a metal, a polymer and/or a fluorochemical), chemical exposure (such as with an oxidant or an etchant), radiation (such as heat or light) and/or any combination thereof. Where the protruding features of the stamp are treated with a surface modifier, a thin layer of the surface modifier can be deposited onto regions of contact between the substrate or print medium and the stamp during the embossing process which alters or modifies the surface properties of the substrate or print medium in the regions of contact and prevents the re-flow of the liquid ink.

Preferably, treating the stamp, in accordance with the present invention, enhances the ability of the protruding features to displace the liquid ink by modifying the surface energy and/or modifying the wettability of the protruding stamp surfaces relative to the recessed stamp surfaces. In accordance with further embodiments of the invention, a protective mask is provided over the protruding surfaces or over the recessed surfaces of the stamp while the other of the protruding surfaces or recessed surfaces are being treated or modified.

In addition to the aforementioned surface modifications, or as a result of the aforementioned surface modifications, the rate of solvent absorption by the stamp is controlled to optimize the soft curing of patterned liquid layers during the embossing process. In accordance with the embodiments of the invention, the rate of solvent absorption by the stamp is controlled by pre-treating a portion of the stamp with a solvent prior to embossing, drawing a vacuum on the stamp while embossing, heating the substrate structure, the stamp and/or the liquid ink while embossing, judicious choice of ink solvent(s) and stamp materials, or any combination thereof.

In accordance with further embodiments of the invention, a stamp with differentiated surfaces is formed by making the protruding features of the stamp from a first material and the recessed features of the stamp from a second material. Preferably, the protruding features of the stamp are formed from a first material which is a relatively non-porous material, such as polydimethylsiloxane (PDMS) and the recessed features, or a portion thereof, are formed from a second material which is relatively porous. In accordance with this embodiment of the invention, the protruding features of the stamp are cast from a mold using a relatively non-porous curable elastomeric material and are attached to a suitable porous backing. Suitable porous backings comprise metal, glass, glass fiber, quartz, polymer foam, mixed cellulose, polycarbonate, polyimide, polytetrafluoroethylene (PTFE), nylon, polyether sulfone (PES), polypropylene, mixed cellulose, polyvinylidene fluoride (PVDF), polysiloxane (such as PDMS) and/or combinations thereof.

In still further embodiments of the invention, a stamp is treated or conditioned between prints. For example, the stamp is dipped into a solvent bath between prints and/or is cleaned by contact with an adhesive surface to remove residue between prints.

In still further embodiments of the invention, a stamp is fabricated with contoured features. In accordance with this embodiment of the invention, a master is formed with contoured cavities for casting a stamp with contoured features.

In yet further embodiments of the invention, a stamp is conditioned or reconditioned between prints to remove solvent or solvents, as explained in detail below.

DETAILED DESCRIPTION OF THE PREFERRED EMBODIMENTS

In accordance with the present invention, a micro-device is fabricated by forming a plurality of patterned device layers, wherein one or more of the patterned device layers are formed using liquid embossing with a stamp. Preferably, the printing process is controlled by using a stamp with differentiated protruding surfaces and recessed surfaces, by controlling the printing conditions and/or a combination thereof.

Figure 1A:
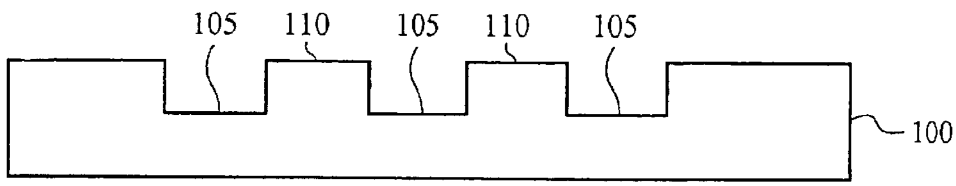
FIGS. 1A–D, show the steps of making an elastomeric stamp, in accordance with the embodiments of the invention.
Figure 1B:
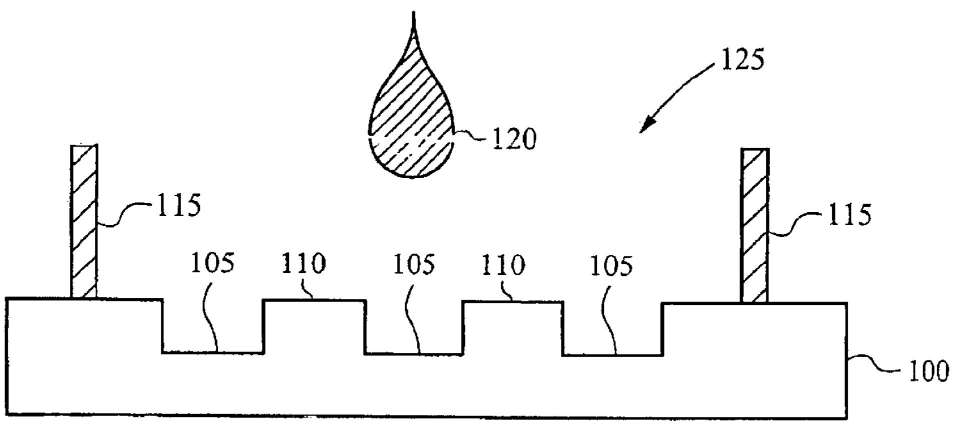
Figure 1C:
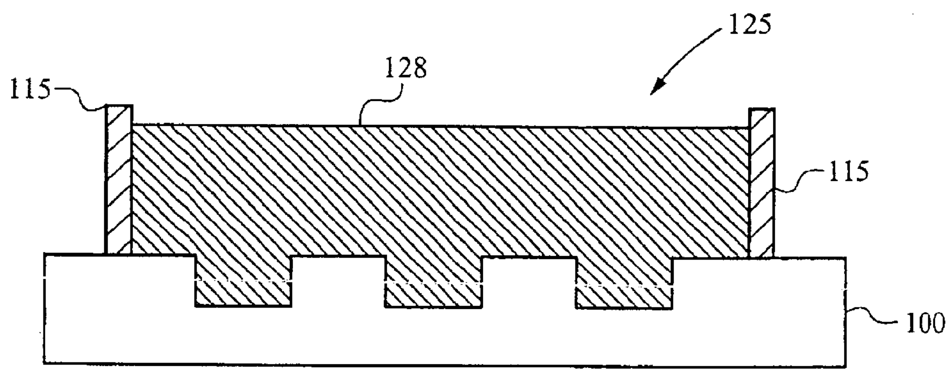
Figure 1D:
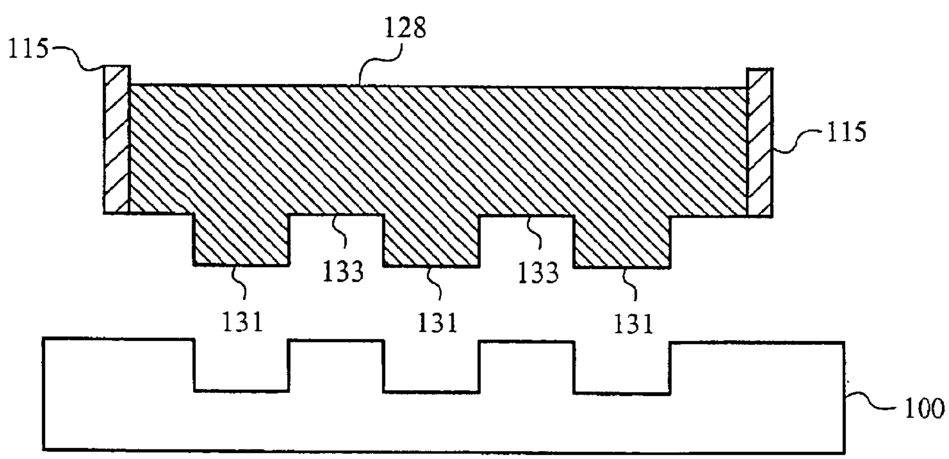

FIGS. 1A–D illustrate exemplary steps for making an elastomeric stamp structure 128 (FIG. 1D). Referring to FIG. 1A, a master 100 is formed having a series of recessed features 105 and protruding features 110, which provides a negative impression for casting the stamp structure 128. The actual dimensions of the features 105 and 110 depend on the intended application of the stamp structure 128 and are determined by the method used to pattern the master 100. In general, however, feature sizes as small as 150 nanometers are possible using lithography techniques.

Still referring to FIG. 1A, the master structure 100 is formed from any number of suitable materials including, but not limited to, silicon-based materials (such as silicon, silicon dioxide, and silicon nitride) and metal. Methods and materials used for making master structures suitable for casting elastomeric stamps are further described in U.S. patent application Ser. No. 09/525,734, entitled "Fabrication of Finely Features Devices by Liquid Embossing" and in U.S. patent application Ser. No. 09/519,722, entitled "Method for Manufacturing Electronic and Electro Mechanical Elements and Devices by Thin Film Deposition and Imaging", referenced previously.

Referring now to FIG. 1B, to cast the stamp structure 128, an uncured liquid elastomer 120, such as polydimethylsiloxane, is poured or deposited over the master structure 100, such that the liquid elastomer 120 fills the recessed features 105 and covers the protruding features 110. In accordance with the embodiments of the invention, a containment structure or wall 115 is provided to form a well 125. The well 125 helps to hold the liquid elastomer 120 over the master structure 100 and helps to control the thickness of the stamp structure 128 formed.

Now referring to FIG. 1C, after the liquid elastomer 120 is poured into the well 125, the elastomer 120 is then cured to form the stamp structure 128. The method and the conditions required to cure the liquid elastomer 120 vary depending on the type of elastomer used. In the case of PDMS, the liquid elastomer 120 is curable by heating the liquid elastomer 120 in an oven at approximately 80 degrees Celsius for approximately 2 hours. Other liquid elastomers are curable using radiation, such as ultra violet radiation and/or chemically by, for example, adding a crossing linking agent to the liquid elastomer 120.

After the stamp structure 128 is formed, then the stamp structure 128 is removed or separated from the master structure 100 and the protruding stamp surfaces 131 and recessed stamp surfaces 133 can then be used to emboss a suitable liquid ink and facilitate the direct patterning of electrical, biological, chemical and/or mechanical materials. In addition to patterning device layers by embossing a liquid ink, the stamp 128 also preferably facilitates the curing of patterned layers by absorbing solvent from the ink, referred to herein as soft curing of a patterned liquid layer. Soft curing of patterned liquid layers by the stamp 128 helps to form a stable pattern with a high degree of feature definition. The stamp materials, designs, ink materials and ink formulations can be judiciously selected to control the rate of solvent absorption. For example, a stamp structure is formed form multiple materials, such that the stamp structure has differentiated protruding surfaces and recessed surfaces, wherein the recessed surfaces are formed from a porous material, or an absorbent material, in order to remove solvent more rapidly from the ink while embossing a liquid layer.

Figure 2A:
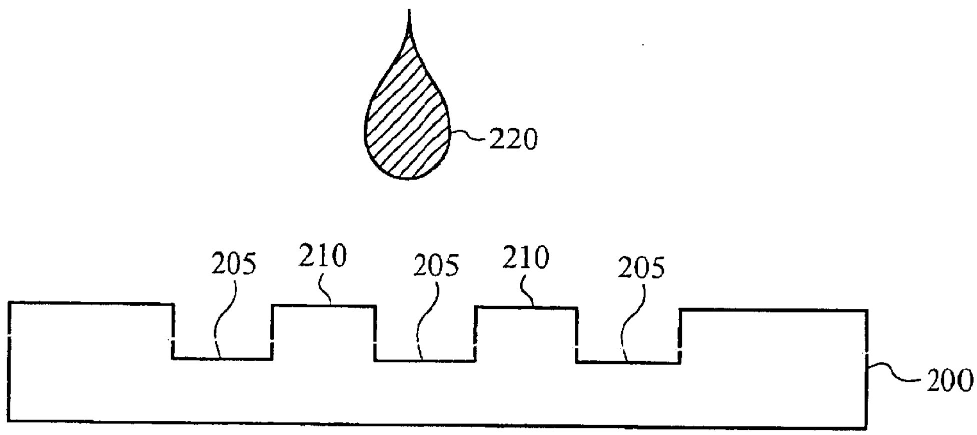
FIGS. 2A–D, show the steps of making a stamp with protruding features formed from a first material and recessed features formed from a second material, in accordance with the embodiments of the invention.
Figure 2B:
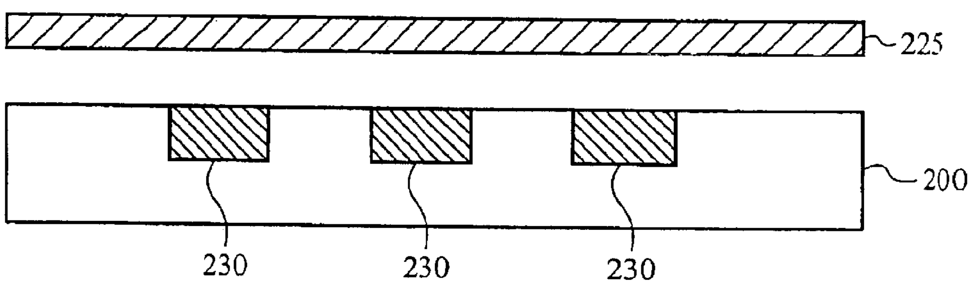

FIGS. 2A–D illustrate the steps of making a stamp with differentiated protruding surfaces and recessed surfaces, in accordance with the embodiments of the invention. Referring to FIG. 2A, to form a stamp structure 235 (FIG. 2D), a first material 220 is poured or coated onto a master structure 200 comprising recessed features 205 and protruding features 210. The first material 220 is poured over the master 200 and at least fills the recessed features 205, as shown in FIG. 2B. The first material 220 is preferably a curable liquid elastomer, such as PDMS, which forms the partial stamp structure 226 (FIG. 2D) and provides protruding stamp surfaces 230.

Figure 2C:
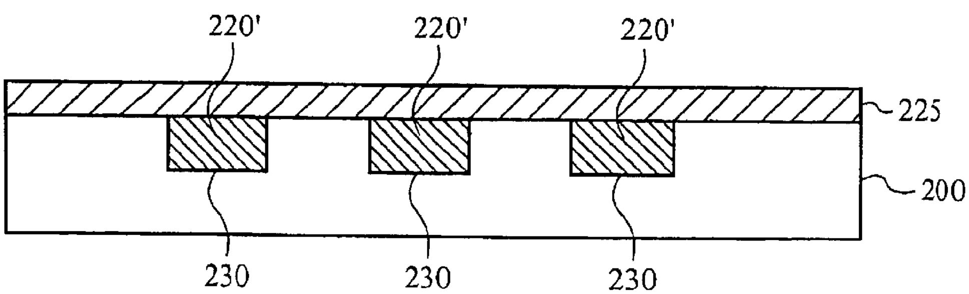
Figure 2D:
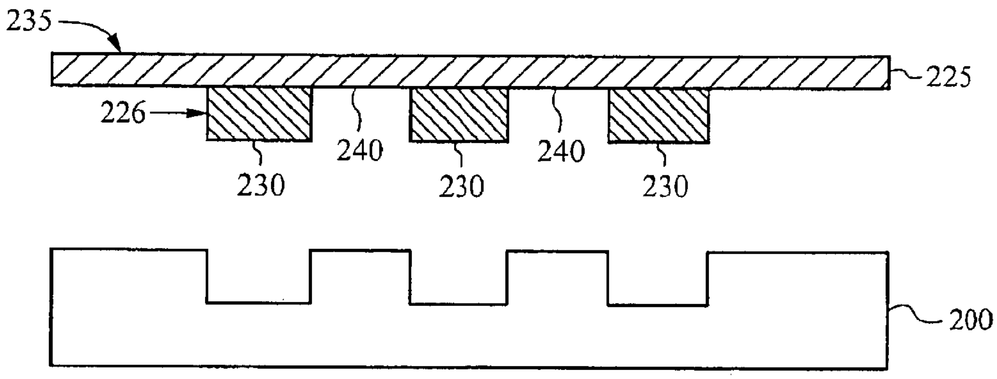

Now referring to FIG. 2C, a second material 225 is attached to the first material or the partial stamp structure 226. The second material 225, in accordance with the invention is a curable elastomer, which when cured, forms a backing structure 225 comprising the recessed surfaces 240 (FIG. 2D), wherein the recessed surfaces 240 have different absorption properties, wetting properties, surface energy properties, or a combination thereof relative to the protruding surfaces 230 of the partial stamp structure 226. When the first material 220 and second material 225 are curable elastomers, they can be cured separately or together.

In accordance with further embodiments of the invention, the backing structure 225 is a preformed solid, which is brought into contact with the first material 220. When the first material 220 is a curable elastomer, curing the first material 220 with the backing structure 225 in contact with the first material 220 is sufficient to attach the backing structure 225 to the partial stamp structure 226 formed. Preferably, the backing material 225 is a porous material that is capable of absorbing organic solvents. Suitable backing materials include, but are not limited to, metal, glass, glass fiber, quartz, polymer foam, mixed cellulose, polycarbonate, polyimide, polytetrafluoroethylene (PTFE), nylon, polyether sulfone (PES), polypropylene, mixed cellulose polyvinylidene fluoride (PVDF), polysiloxane (such as PDMS) and combinations thereof.

It will be clear to one skilled in the art that the partial stamp structure 226 can be coupled or attached to make a stamp 235 with differentiated protruding surfaces 230 and recessed surfaces 240 using any number of methods including providing a third material (not shown), such as an adhesive material between partial stamp structure 226 and the backing structure 225.

Regardless of how the partial stamp structure 226 and the backing structure 225 are coupled, the resultant stamp structure 235 is then removed or separated from the master 200 and the protruding surfaces 230 comprising the first materials 220 and the recessed surfaces 240 comprising the second materials 225 can be used to emboss a suitable liquid ink in a liquid embossing process, such as described above.

Figure 3A:
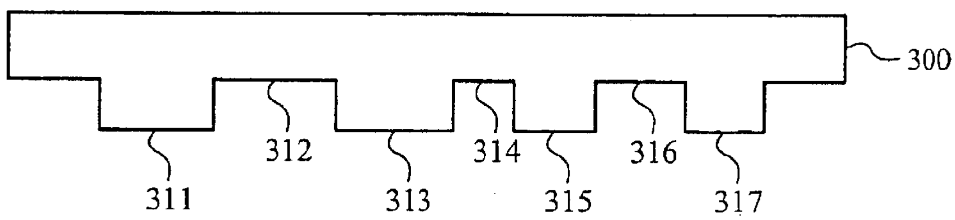
FIGS. 3A–F, show the steps of making a stamp with differentiated protruding surfaces and recessed surfaces, in accordance with the embodiments of the invention.
Figure 3B:
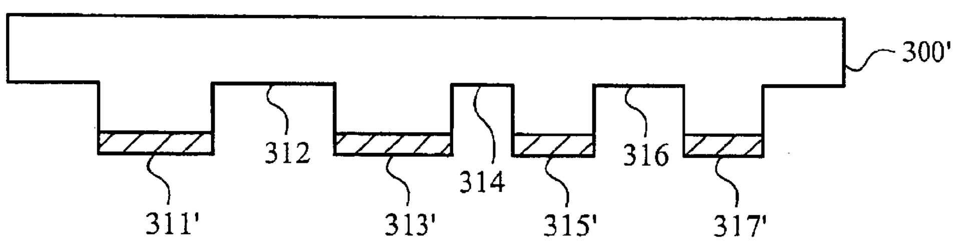
Figure 3C:
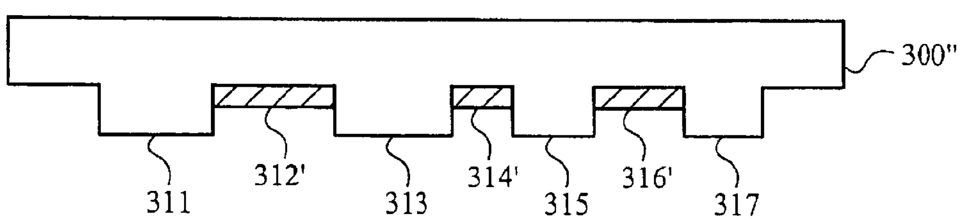

Referring now to FIG. 3A, a stamp 300 is formed from one or more materials, as described above. The stamp 300 comprises a set of protruding surfaces 311, 313, 315 and 317 and a set of recessed surfaces 312, 314 and 316 for embossing a pattern into a layer of liquid ink. In accordance with the embodiments of the invention, the set of protruding surfaces 311, 313, 315 and 317 is treated to form a modified stamp 300' with differentiated sets of protruding surfaces 311', 313', 315' and 317' and recessed surfaces 312, 314, and 316, as shown in FIG. 3B. Alternatively, the set of recessed surfaces 312, 314, and 316, is selectively modified to form a modified stamp 300" with a differentiated set of protruding surfaces 311, 313, 315 and 317 and recessed surfaces 312', 314', and 316', as shown in FIG. 3C. In yet further embodiments of the invention, the set of protruding surfaces 311, 313, 315 and 317 and the set of recessed surfaces 312, 314 and 316 are both selectively treated to form a modified stamp (not shown) with a differentiated set of protruding surfaces 311', 313', 315' and 317' and set of recessed surfaces 312', 314' and 316'.

Figure 3D:
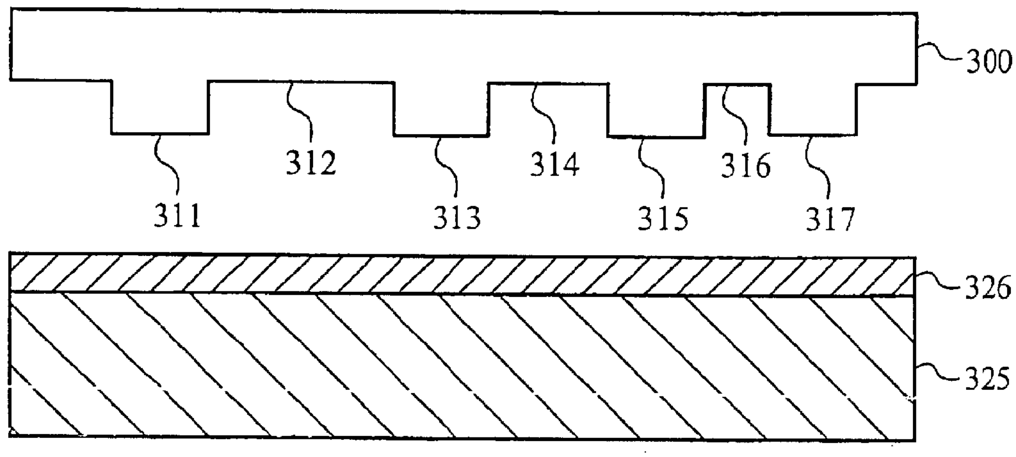
Figure 3E:
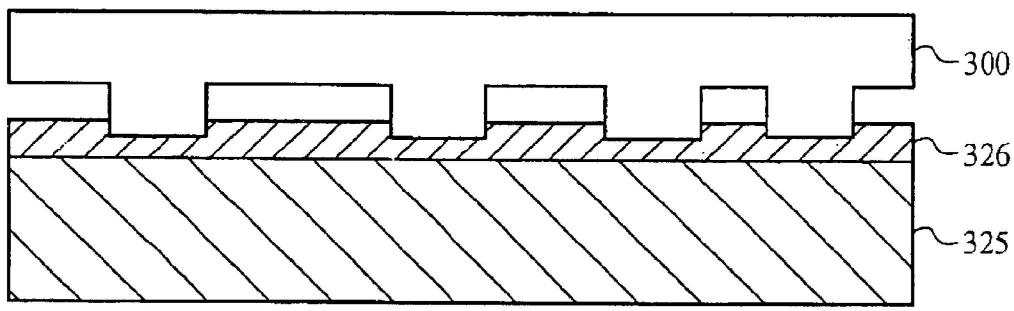
Figure 3F:
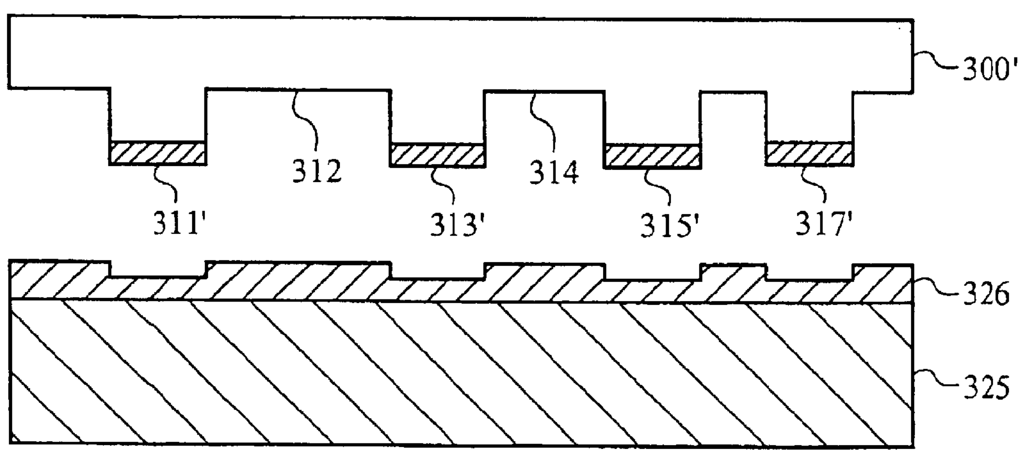

FIGS. 3D–F will now be used to illustrate a technique for selectively treating a set of protruding surfaces, in accordance with an embodiment of the present invention.

Referring now to FIG. 3D, a surface modifier 326 is coated or deposited onto a substrate 325. The surface modifier 326 is a solvent, an acid, an oxidant, a polymer, a pre-polymer, a fluorochemical (such as a fluorocarbon, a fluorosilicon or other fluorinated compound), or any other material and/or combination of materials which is capable of modifying the absorption properties, the wetting properties and/or the surface energy properties of the set of the protruding stamp surfaces 311, 313, 315 and 317.

In order to form the modified stamp 300 with treated protruding surfaces 311', 313' 315' and 317', the stamp 300 is brought into contact with the surface modifier 326, as shown FIG. 3E, such that at least a portion of the protruding surfaces 311, 313, 315 and 317 are coated with the surface modifier 326. The surface modifier 326 either adheres to or is absorbed into the protruding surfaces 311, 313, 315 and 317 and chemically and/or physically alters the protruding surfaces 311', 313', 315' and 317' to form the modified stamp structure 300'. The modified stamp structure 300' can then be used to emboss a layer of liquid ink.

A stamp, in accordance with further embodiments of the invention, is modified to have differentiated protruding surfaces and recessed surfaces by coating or treating selected portions of a stamp using any number of methods including vapor coating and sputter coating methods. In yet further embodiments of the invention, a modified stamp structure with differentiated protruding surfaces and recessed surfaces is formed by selectively exposing one or both of the protruding surfaces and recessed surfaces to a radiation source, such as a heat source, light source, or electron beam source, wherein the exposed surfaces are modified by the radiation source.

A stamp, in accordance with yet further embodiments of the invention is formed by blanket coating an embossing surface of a stamp comprising protruding and recessed surfaces with a surface modifier and then selectively removing the surface modifier from a portion of the protruding surfaces and/or recessed surfaces to form differentiated embossing surfaces. Generally, however, wherein the coating method or deposition method used is indiscriminate, wherein the surface modifier is difficult to remove from the stamp and/or wherein coating the stamp surfaces irreversibly alters the stamp surface, then a mask is preferably provided to prevent selected surfaces from becoming coated or contaminated by the surface modifier. FIGS. 4A–E and FIGS. 5A–C will now be used to illustrate the use of a protective mask to selectively coat or treat surfaces of a stamp with a surface modifier.

Figure 4A:
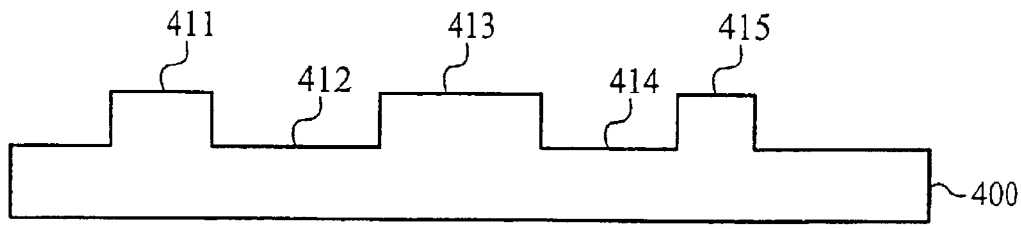
FIGS. 4A–E, show the use of a protective mask formed over the recessed stamp surfaces prior to treating the protruding stamp surfaces, in accordance with the method of the invention.
Figure 4B:
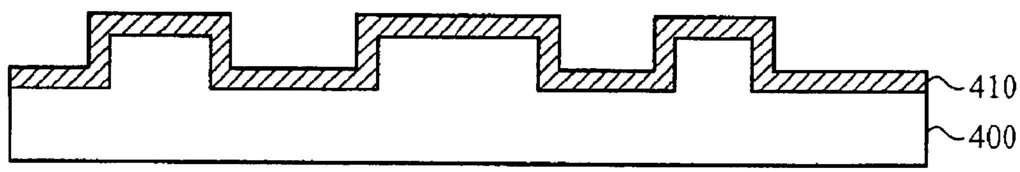

Referring to FIG. 4A, a stamp 400 comprises protruding surfaces 411, 413 and 415 and recessed surfaces 412 and 414, as described previously. To make a modified stamp 400' (FIGS. 4D–E) with a differentiated embossing surface, the compliment of protruding surfaces 411, 413 and 415 and recessed surfaces 412 and 414 are coated with a masking material 410 as shown in Figured 4B. The masking material 410 is any masking material which can be selectively removed, but is preferably a photo-resist that can be exposed and developed using lithographic techniques in the art.

Figure 4C:
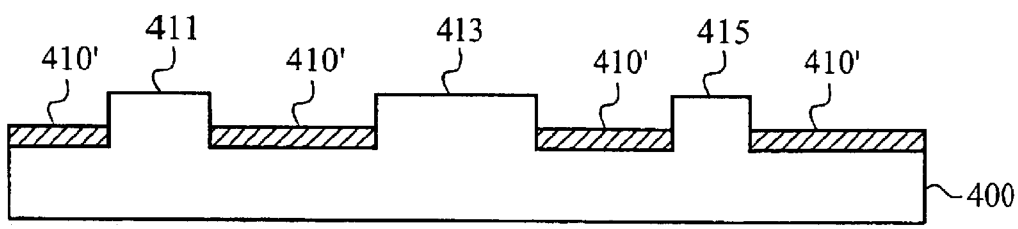
Figure 4D:
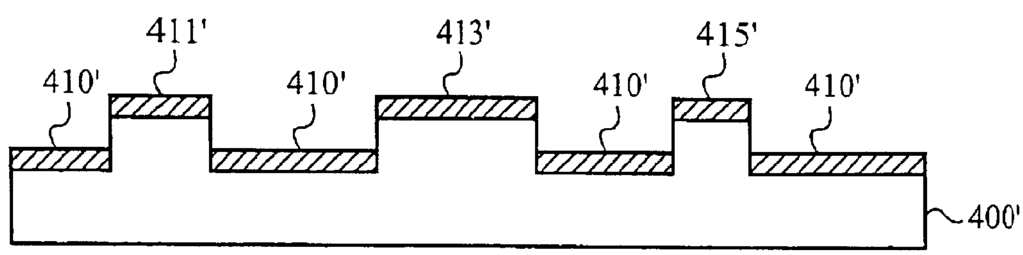

After the stamp 400 is coated with the masking material 410, then the masking material 410 is selectively removed from the protruding surfaces 411, 413, and 415 of the stamp 400 to form the mask 410', as shown in FIG. 4C. After the mask 410' is formed, the protruding surfaces 411, 413 and 415 of the stamp 400 are then selectively treated with a surface modifier to form the modified stamp 400' with differentiated embossing surfaces 410', 411', 413' and 415'.

Figure 4E:
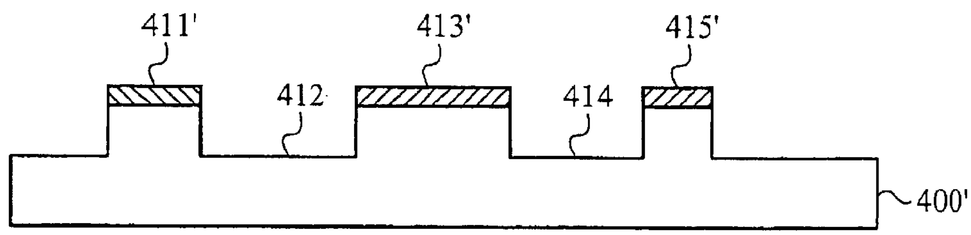

Now referring to FIG. 4E, in accordance with the embodiments of the invention, after the protruding surfaces 411, 413 and 415 of the stamp 400 are selectively treated with a surface modifier, then the mask 410' can be removed to form a modified stamp 400' with differentiated embossing surfaces 411', 412, 413', 414 and 415'.

Figure 5A:
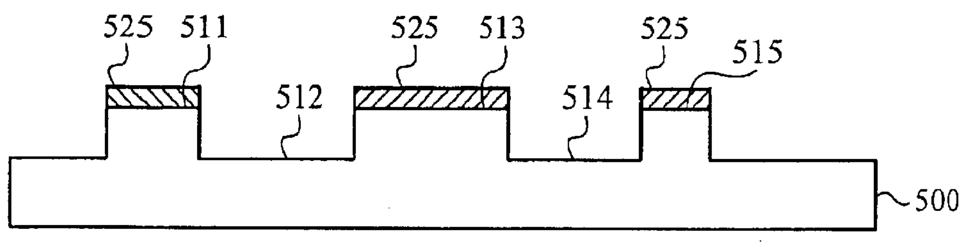
FIGS. 5A–C, show the use of a protective mask formed over the protruding stamp surfaces prior to treating the recessed stamp surfaces, in accordance with the method of the invention.
Figure 5B:
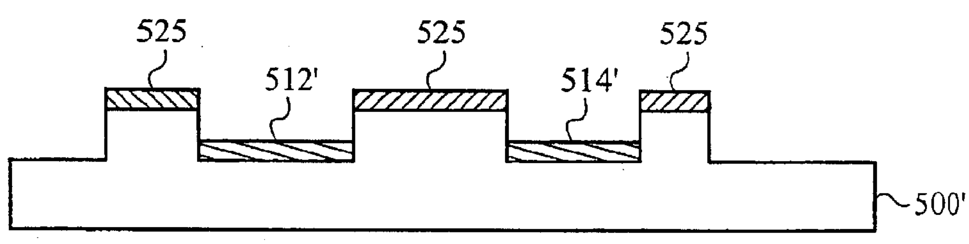

Referring to FIG. 5A, in a similar process, a stamp 500 comprising protruding surfaces 511, 513 and 515 and recessed surfaces 512 and 514 is provided with a mask 525. However, in this case, the mask 525 is selectively formed on the protruding surfaces 511, 513 and 515, by dip-coating the protruding surfaces 511, 513 and 515 into a curable masking material (FIG. 3E), or any other method suitable for coating or depositing a masking material onto the protruding surfaces 511, 513 and 515. After the mask 525 is formed on the protruding surfaces 511, 513 and 515 of the stamp 500, the recessed surfaces are then selectively treated with a surface modifier to form a modified stamp structure 500' with differentiated embossing surfaces 525, 512' and 514', as shown in FIG. 5B.

Figure 5C:
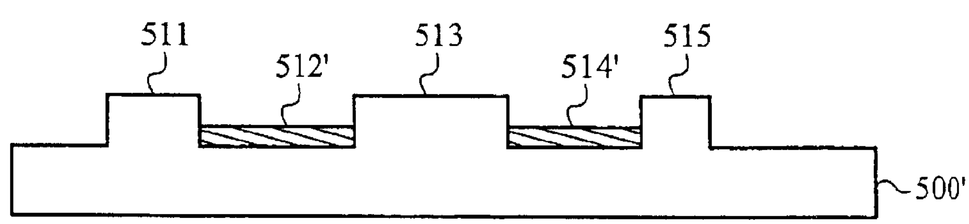

Referring to FIG. 5C, after the recessed surfaces 512 and 514 are selectively treated with the surface modifier through the mask 525, then in accordance with further embodiments of the invention, the mask 525 is removed to form the modified stamp 500' with a differentiated embossing surfaces 511, 512' 513, 514' and 515.

Figure 6A:
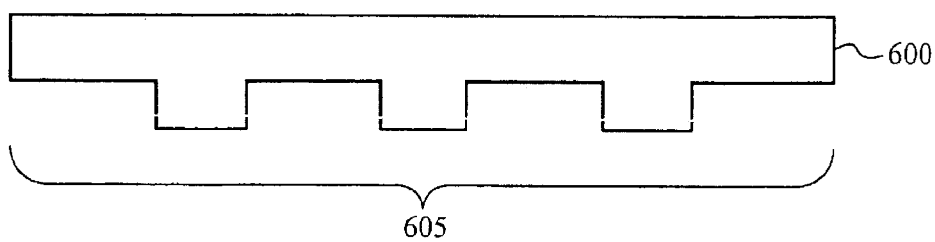
FIGS. 6A–B, show pre-treatment of a stamp, in accordance with the embodiments of the invention.
Figure 6B:
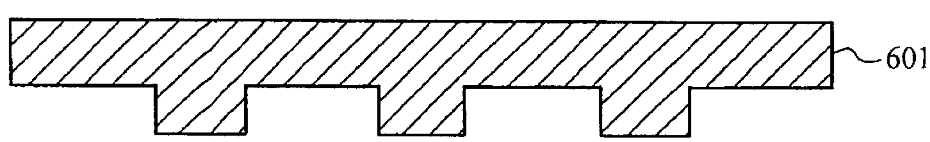

Referring now to FIG. 6A, in accordance with yet further embodiments of the invention, a stamp 600 comprising an embossing surface 605 comprising protruding and recessed surfaces, as described above, is non-selectively treated in order to convert the stamp 600 to a modified stamp 601 (FIG. 6B). Non-selective treatment methods include, but are not limited to thermal treatment of the stamp 600, soaking or pre-soaking the stamp 600 in a solvent or other material which is absorbed into the stamp 600, photo-treatment or radiation treatment of the stamp 600, pressure treatment of the stamp 600 and combinations thereof. Non-selective treatment of the stamp 600 to form the modified stamp 601, as illustrated in FIGS. 6A–B, can also be used in combination with the selective surface modification techniques described in detail above.

The stamp structures thus far have been illustrated with protruding features and recessed features having substantially flat surfaces. However, in some applications, stamps with contoured protruding and/or recessed features are preferred, because the contoured protruding and/or recessed features can facilitate the displacement of liquid during an embossing process.

Figure 7A:
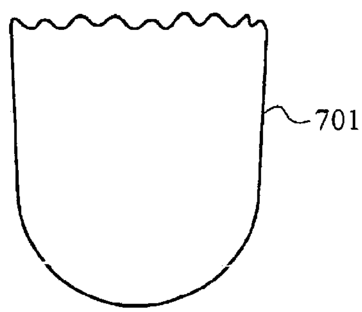
FIGS. 7A–E, show cross-sectional views of protruding stamp features or recessed features with contoured surfaces.
Figure 7B:
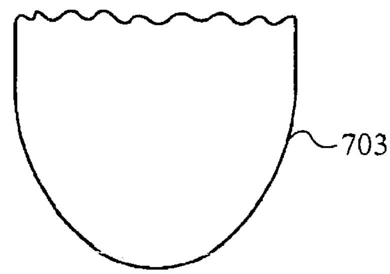
Figure 7C:
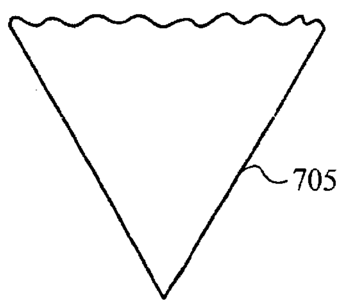
Figure 7D:
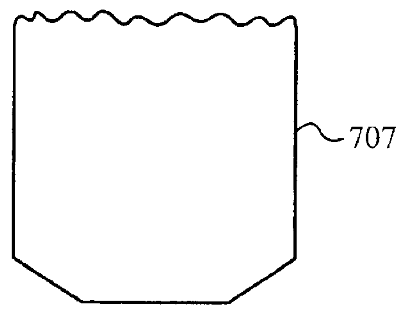
Figure 7E:
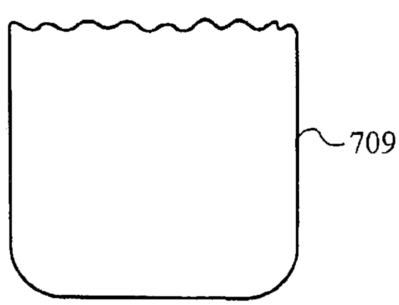

FIGS. 7A–E illustrate a few exemplary geometries of contoured protruding and/or recessed embossing stamp features, in accordance with the embodiments of the invention. FIG. 7A, shows a cross-sectional view of a rounded contoured stamp feature; Figure B shows a cross-sectional view of an oval contoured stamp feature; FIG. 7C shows a cross-sectional view of a triangular contoured stamp feature; FIG. 7D shows a cross-sectional view of a trapezoidal stamp feature; and FIG. 7E shows a cross-sectional view of a stamp feature with rounded corners. It will be clear to one skilled in the art that any number of different geometries and combinations of geometries for protruding stamp features and recessed stamp features are within the scope of the invention.

Figure 8A:
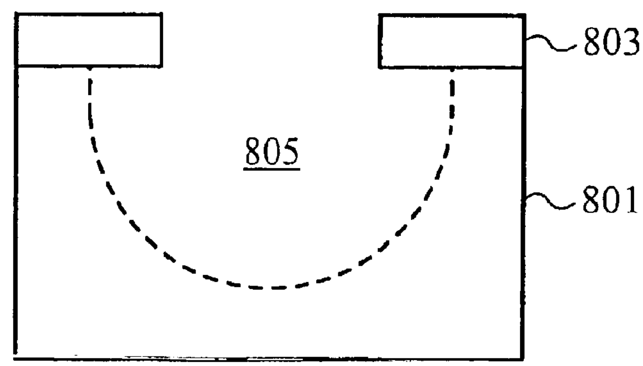
FIGS. 8A–E, show cross-sectional views of master structures with contoured cavities for casting stamps with contoured protruding features, such as illustrated in FIGS. 7A–E.
Figure 8B:
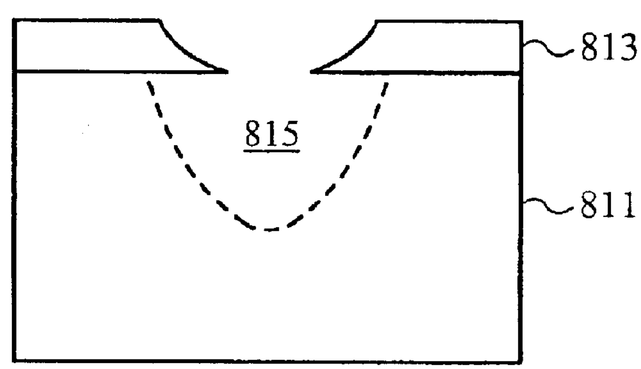
Figure 8C:
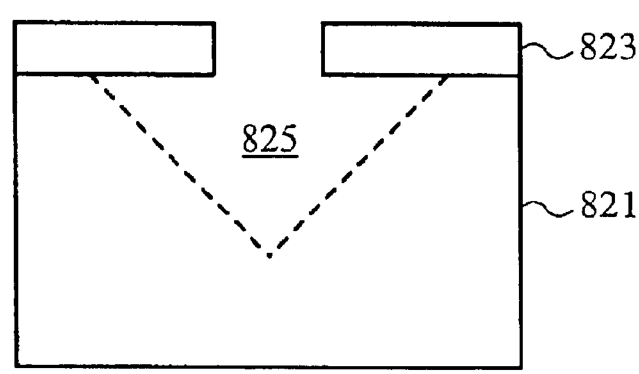
Figure 8D:
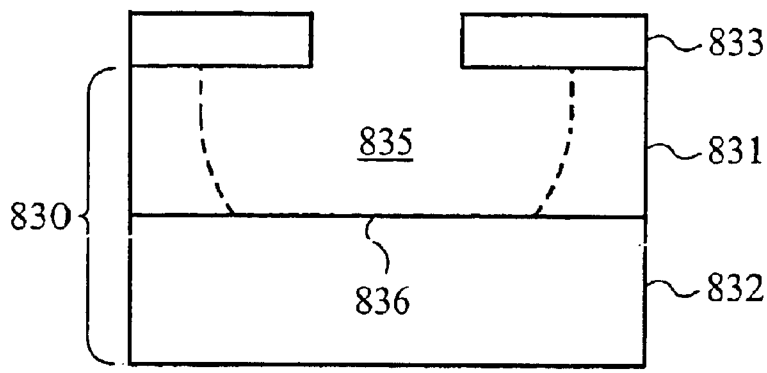
Figure 8E:
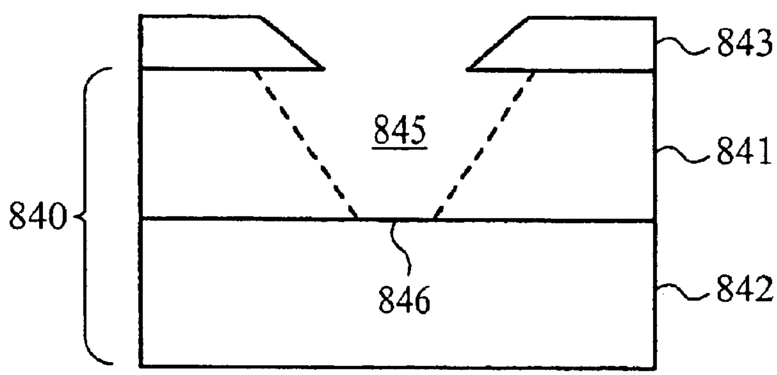

In order to make stamp structures with contoured features, such as described above, it is preferable to form a master with contoured cavities for casting stamps with contoured embossing features. FIGS. 8A–E show several master structures with contoured cavity profiles to cast stamps with contoured features, such as described above. FIG. 8A shows a structure with an etch mask 803 formed over a suitable substrate 801 that is isotropically etched to form the curved or rounded cavity 805; FIG. 5B shows a structure with a mask 813 formed over the a suitable substrate 811 that is anisotropically etched through the mask 813 to form an oval shaped cavity 815; and FIG. 8C shows a structure with a mask 823 formed over a suitable substrate 821 that is isotropically etched through the mask 823 to form a triangular cavity 825. FIGS. 8A–C show profiles of contoured cavities that are formed without providing etch-stop layers. By providing etch-stop layers, contoured cavities can be formed which have flattened bottom profiles, such as shown in FIGS. 8D–E.

Referring now to FIG. 8D, a master structure with a curved cavity 835 and a flattened bottom 836 is formed by providing a substrate structure 830 with an etch-stop layer 832, a sacrificial layer 831 and a mask 833 deposited over the sacrificial layer 831. The sacrificial layer 831 is isotropically etched through the mask 833 down to the etch-stop layer 832 to form the curved cavity 835 with the flattened bottom 836.

Referring now to FIG. 8E, a master structure with a tapered cavity 845 and a flattened bottom 846 is formed by providing a substrate structure 840 with an etch-stop layer 842, a sacrificial layer 841 and a mask 843 deposited over the sacrificial layer 841. The sacrificial layer 841 is anisotropically or isotropically etched through the mask 843 down to the etch-stop layer 842 to form the tapered cavity 845 with the flattened bottom 846.

Figure 9:
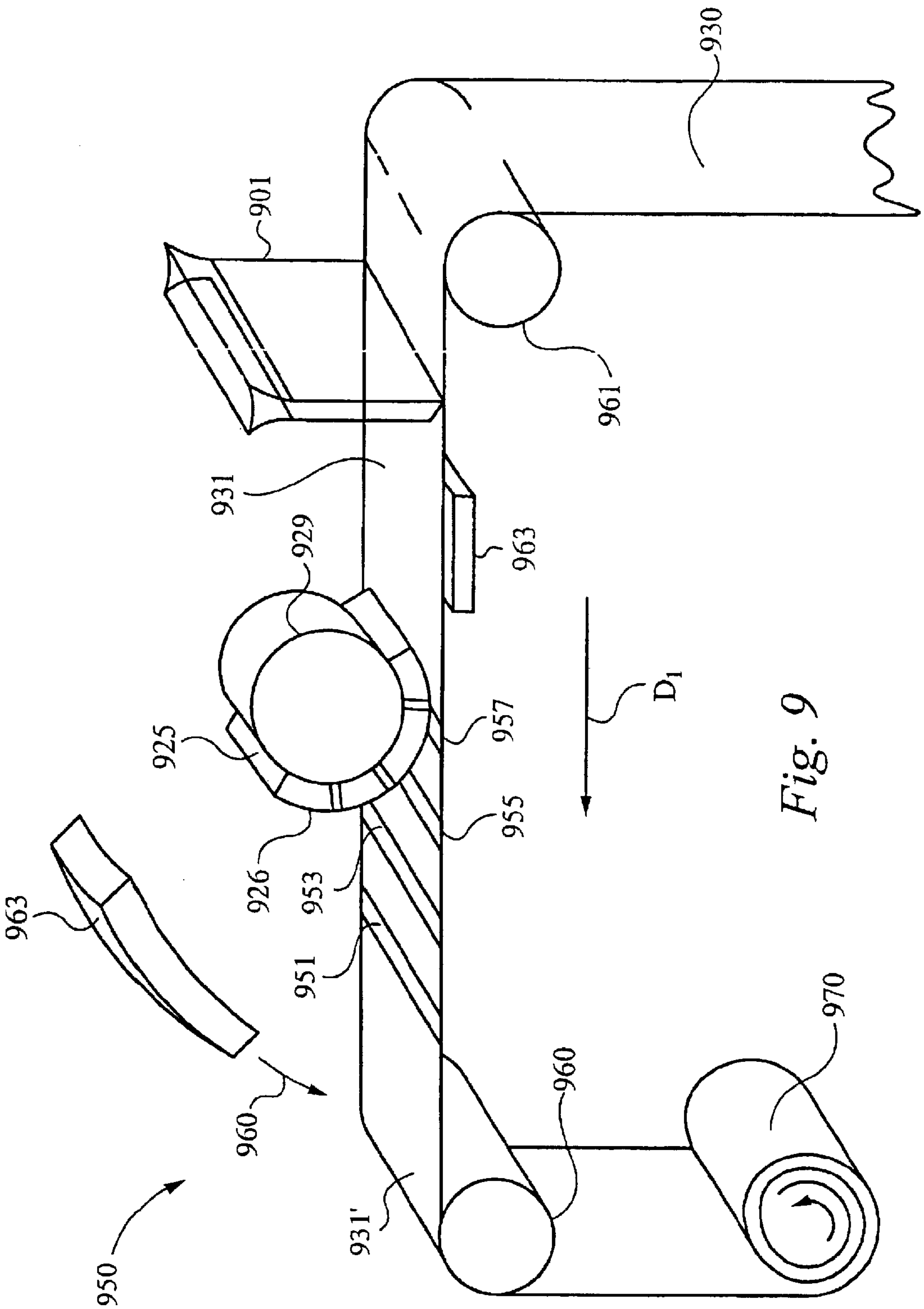
FIG. 9, shows a liquid embossing system, in accordance with the embodiments of the invention.

Referring now to FIG. 9, a system 950, in accordance with the embodiments of the present invention comprises a mechanism for coupling a print medium 930 with stamp 925. The stamp 925 comprises an embossing surface 926 with protruding surfaces and recessed surfaces for embossing a print into a layer of liquid ink deposited on a print medium 930, referred to herein as an inked print medium 931. The system 950, in accordance with the embodiments of the invention, comprises a drum structure 929 for holding the stamp 925 and for rolling the embossing surface 926 of the stamp 925 over the inked print medium 931 to emboss the features 951, 953, 955 and 957 through the layer of liquid ink to generate an embossed print medium 931'. All or a portion of the embossing surface 925 of the stamp 925 comprises differentiated protruding surfaces and/or recessed surfaces that are modified by the methods described above.

In accordance with the embodiments of the invention, the system 950 is configured to move the inked print medium 931 in a direction D, along the stamp 925, such that the inked print medium 931 passes under a stationary, moving and/or rotating drum structure 929. The system 950 also preferably comprises an ink supply 901 for coating the print medium 930 with a suitable ink to form ink printed medium 931. Suitable inks include, but are not limited to, nanoparticle inks, such as those described above.

The system 950, in accordance with yet further embodiments of the invention is configured to assist in the removal of solvent from the ink while embossing the inked print medium 931 by heating the stamp 925 and/or drawing a vacuum on the stamp 925 through the drum 929. The system 925, in yet further embodiments of the invention comprises a heat source 963 for heating the print medium 931 and/or ink, prior to, during or after embossing the inked print medium 931.

When the medium 930 is flexible, the system 925 can be configured with rollers 960 and 961 for controlling the direction, movement and tension of the print medium 930. The system 950 can also be configured with an accumulator 970 and/or winder for controlling windup of the printed medium 931'. The system 950 can further include alignment features for aligning the stamp 925 with the inked print medium 931, drying and/or curing means 961 for exposing the printed medium 931' to a curing radiation 960 and/or converting stations (not shown) for cutting and organizing the printed medium 931'.

The present invention has been described in terms of specific embodiments incorporating details to facilitate the understanding of the principles of construction and operation of the invention. As such, references, herein, to specific embodiments and details thereof are not intended to limit the scope of the claims appended hereto. It will be apparent to those skilled in the art that modifications can be made in the embodiment chosen for illustration without departing from the spirit and scope of the invention.

What is claimed is:

1. A method comprising:

a. embossing a layer of a liquid with a stamp comprising a patterned region with protruding features and recessed features; and b. controlling absorption of a solvent medium from the liquid, wherein controlling the absorption of the solvent medium comprises pre-treating the stamp, such that the recessed features and protruding features absorb the solvent medium at different rates.

2. The method of claim 1, wherein pre-treating the stamp comprises coating at least a portion of the protruding features with a polymer.

3. The method of claim 2, wherein the polymer is selected from the group consisting of a fluorocarbon and a fluorosilicon.

4. The method of claim 1, wherein pre-treating the stamp comprises coating at least a portion of the protruding features with a metal-based material.

5. The method of claim 4, wherein the metal-based material comprises a metal selected from the group consisting of Ag, Pd, Rh, Cu, Pt, Ni, Fe, Ru, Os, Mn, Sn, Cr, Mo, W, Co, Ir, Zn, Au and Cd.

6. The method of claim 1, further comprising depositing a protective mask on the recessed features prior to pretreating the stamp.

7. The method of claim 1, wherein pre-treating the stamp comprises thermally treating at least a portion of the protruding features.

8. The method of claim 1, wherein pre-treating the stamp comprises etching at least a portion of the protruding features or recessed features.

9. The method of claim 1, wherein at least one of the protruding features and the recessed features comprise a polymeric material.

10. The method of claim 9, wherein the polymeric material is polydimethylsiloxane (PDMS).

11. The method of claim 1, wherein pre-treating the stamp comprises exposing at least a portion of the stamp to the solvent medium.

12. The method of claim 1, wherein controlling the absorption of the solvent medium comprises heating the stamp.

13. The method of claim 1, wherein controlling the absorption of the solvent medium comprises heating the liquid.

14. The method of claim 1, wherein controlling the absorption of the solvent medium comprises drawing a vacuum on at least a portion of the stamp.

15. The method of claim 1, wherein the liquid comprises a dispersion of nanoparticles.

16. The method of claim 15, wherein the nanoparticles are nanoparticles selected from the group consisting of metal nanoparticles, semiconductor nanoparticles, dielectric nanoparticles, magnetic nanoparticles, piezo-electric nanoparticles, pyro-electric nanoparticles and oxide nanoparticles.

17. The method of claim 1, wherein the solvent medium comprises an organic solvent comprising five or more carbon atoms.

18. The method of claim 17, wherein the organic solvent is selected from the group consisting of tetralin, cyclohexylbenzene, terpineols, 2-ethylhexanol, 3-octanol, indan, dimethylbenzene, gamma-butyrolactone, cyclohexanone, dihydrobenzofuran, decaline, 1-heptanol, 2-methyl-2,4-pentanediol, phenetylalcohol, citronellol, geraniol, diethyleneglycolmonoethylether, diethyleneglycolmonomethylether, phenetole, ethyllactate, diethylphthalate, glyme, diglyme, triglyme, tetraglyme, pine oil, cineole, octanol, hexanol and pentanol.

19. The method of claim 1, wherein the liquid comprises a polymer.

20. The method of claim 19, wherein the polymer is selected from the group consisting of a photo-resist polymer and a spin-on-glass polymer.

21. The method of claim 1, wherein pre-treating the stamp comprises coating the protruding features with a reactive pre-polymer and photo-initiating the pre-polymer to form a polymeric coating on the protruding features.

22. A method of making an electronic device comprising:

a. depositing a layer of liquid onto a substrate structure; and b. patterning the layer of liquid by contacting a stamp with the substrate structure, the stamp comprising a patterned region with protruding surfaces and recessed surfaces and wherein the wettability of the protruding surfaces by the liquid is different than the wettability of the recessed surfaces.

23. The method of claim 22, further comprising repeating steps (a) and (b) to form a plurality of patterned layers.

24. The method of claim 22, wherein the liquid is a polymer.

25. The method of claim 24, wherein the polymer is a photo-polymer.

26. The method of claim 22, wherein the liquid is a nanoparticle ink.

27. The method of claim 26, wherein the nanoparticle ink comprises nanoparticles selected from the group consisting of metal nanoparticles, semiconductor nanoparticles, dielectric nanoparticles, magnetic nanoparticles, piezoelectric nanoparticles, pyro-electric nanoparticles and oxide nanoparticles.

28. The method of claim 22, wherein the stamp comprises a polymeric material.

29. The method of claim 28 wherein the polymeric material is polydimethylsiloxane (PDMS).

30. The method of claim 22, further comprising treating the protruding surfaces with a surface modifier.

31. The method of claim 30, wherein the surface modifier comprises a fluorochemical selected from the group consisting of a fluorocarbon and a fluorosilane.

32. The method of claim 30, wherein the surface modifier is an oxidizer.

33. The method of claim 32, wherein the oxidizer is selected from the group consisting of a liquid acid, ozone, a gaseous etchant, plasma, light, an electron beam and actinic radiation.

34. The method of claim 30, further comprising covering the recessed surfaces with a mask prior to treating the protruding surfaces with the surface modifier.

35. The method of claim 22, wherein the liquid comprises a solvent.

36. The method of claim 35, further comprising controlling the absorption of the solvent from the liquid.

37. The method of claim 36, wherein controlling the absorption of a solvent comprises heating at least one of the stamp and the liquid.

38. The method of claim 36, wherein controlling the absorption of a solvent comprise drawing a vacuum on at least a portion of the stamp.

39. The method of claim 22 wherein the liquid comprises nanoparticles.

40. The method of claim 39, wherein the nanoparticles are nanoparticles selected from the group consisting of metal nanoparticles, semiconductor nanoparticles, dielectric nanoparticles, magnetic nanoparticles, piezo-electric nanoparticles, pyro-electric nanoparticles and oxide nanoparticles.

41. The method of claim 22, wherein the substrate structure comprises a material selected from the group consisting of silicon, quartz, glass, sapphire and a polymeric material.

42. The method of claim 41, wherein the substrate structure further comprises an interface layer.

43. A method comprising:

a. embossing a layer of a liquid with a stamp comprising a patterned region with protruding features and recessed features; and b. controlling the absorption of a solvent medium from the liquid, wherein controlling the absorption of a solvent comprises drawing a vacuum on at least a portion of the stamp.

* * * * *

UNITED STATES PATENT AND TRADEMARK OFFICE

CERTIFICATE OF CORRECTION

PATENT NO. : 6,957,608 B1
DATED : October 25, 2005
INVENTOR(S) : Brian Hubert et al.

It is certified that error appears in the above-identified patent and that said Letters Patent is hereby corrected as shown below:

Column 12,
Line 32, between "controlling" and "absorption" delete "the" and insert -- an --.
Line 35, between "of" and "solvent" delete "a" and insert -- the --.
Line 38, between "of" and "solvent" delete "a" and insert -- the --; and delete "comprise" and insert -- comprises --.

Signed and Sealed this

Eleventh Day of April, 2006

JON W. DUDAS
*Director of the United States Patent and Trademark Office*